United States Patent [19]

Burghardt et al.

[11] Patent Number: 4,969,152
[45] Date of Patent: Nov. 6, 1990

[54] PHOTO-LASERTRANSISTOR

[75] Inventors: Hartmut Burghardt, Holzkirchen; Klaus-Dieter Muehlbauer, Groebenzell, both of Fed. Rep. of Germany

[73] Assignee: Siemens Aktiengesellschaft, Berlin and Munich, Fed. Rep. of Germany

[21] Appl. No.: 250,791

[22] Filed: Sep. 28, 1988

[30] Foreign Application Priority Data

Sep. 28, 1987 [DE] Fed. Rep. of Germany ....... 3732626

[51] Int. Cl.$^5$ .............................................. H01S 3/19
[52] U.S. Cl. ...................................... 372/50; 357/17; 357/34
[58] Field of Search ...................... 372/50; 357/17, 34, 357/37

[56] References Cited

U.S. PATENT DOCUMENTS 4,176,367  11/1979  Uematsu ................................ 357/19
4,349,906   9/1982  Scifres et al. ........................ 372/50
4,845,535   7/1989  Yamanishi et al. .................... 372/46

FOREIGN PATENT DOCUMENTS 0051505  5/1982  European Pat. Off. .

OTHER PUBLICATIONS

J. Campbell et al., "Optical Comparator: A New Application for Avalanche Phototransistors", *IEEE Transactions on Electron Devices*, vol. ED-30, No. 4, Apr. 1983, pp. 408–411.
"Operation Principle of the InGaAsP/InP Laser Transistor", Mori et al., Appl. Phys. Lett 47 (7), Oct. 1, 1985, pp. 649–651.
"Integrated Optical Devices of InGaAsP/InP Heterojunction Phototransistor and Inner . . . ", Sasaki et al, Journal of Lightwave Technology, LT-3, Dec. 1985, pp. 1264–1268.
"Efficient Semiconductor Anti-Stokes Light Converters", Beneking et al., Int'l Electron Devices Meeting, 12/9–11/74, Washington, DC, Technical Digest, IEEE, pp. 69–72.
Patent Abstracts of Japan, vol. 9, No. 332 (E-370) (2055), Dec. 26, 1985; & JP-A-60 164 369 (Nippon Denki K.K.) 27.08.1985.
Patent Abstracts of Japan, vol. 8, No. 25 (E-225) (1462), Feb. 2, 1984; & JP-A-58 186 979 (Tateishi Denki K.K.) 01.11.1983.
"InGaAsP-InP Heterojunction Phototransistors and Light Amplifiers", Sasaki et al., Japanese Journal of Applied Physics, vol. 20 (1981) Apr., No. 4, Tokyo, Japan, pp. L-283-286.

*Primary Examiner*—James W. Davie
*Attorney, Agent, or Firm*—Adel A. Ahmed

[57] ABSTRACT

The invention relates to a photo-laser transistor with a base-collector pn-junction biased in the non-conducting direction and a base-emitter pn-junction biased in the conducting direction. With the invention, the functions of optical to electronic conversion, amplification, electrical to optical conversion, and, in particular, that of an optical repeater are to be realized in one single semiconductor element. For this purpose, the invention provides that the base-emitter pn-junction is formed as laser diode, that the laser diode is driven with a base precurrent to approximately its threshold value, and the residual current, which needs to be made available for stepping over the threshold, stems from the amplified photocurrent of the base-emitter pn-junction. The photolaser transistor according to the invention is applied, in particular, as optical repeater, optical amplifier, optical bus connection building block, optical sensor, wavelength converter, opto-electrical logic respectively opto-electrical switch.

3 Claims, 1 Drawing Sheet

PHOTO-LASERTRANSISTOR

FIELD OF THE INVENTION

The present invention relates to photo-lasertransistors, and more particularly to a photo-lasertransistor with a base-collector pn-junction biased in the non-conducting direction and a base-emitter pn-junction biased in the conducting direction.

BACKGROUND OF THE INVENTION

Photo as well as laser transistors are known. A new application for an avalanche phototransistor, specifically operated as an optical comparator, is described in the journal IEEE TRANSACTIONS ON ELECTRON DEVICES, Vol. ED-30, No. 4, April 1983, pages 408 to 411. The operating principle of an InGaAsP/InP laser transistor is, for example, known from the publication in Appl. Phys. Lett. 47(7), Oct. 1, 1985, Pages 649 to 651.

With increasing miniaturization in the field of optoelectronics it is desirable to build complex microsystems consisting of sensing, logic and actuating elements, in largely an integrated form. Thus, for example, integrated optical elements are known, in which a phototransistor is combined with an InGaAsP/InP heterojunction with a luminescent diode (LED) (JOURNAL OF LIGHTWAVE TECHNOLOGY, Vol. LT 3, No. 6, December 1985, pages 1264 to 1269).

Furthermore, semiconductor elements for processing optical data signals with respect to amplitude and pulse duration, so-called optical repeaters, are known, specifically in the form of hybrid repeaters or in the form of an optoelectronically integrated repeater, with several semiconductor elements such as, for example, a photodiode, transistors, a laser diode, being monolithically integrated.

SUMMARY OF THE INVENTION

As aspect of the present invention relates to the task of realizing the functions of optical to electrical conversion respectively electrical to optical conversion, of amplification, and in particular, that of an optical repeater in a single semiconductor element.

This task is solved in accordance with the invention by a photo-lasertransistor having the features of claim 1.

Advantageous models and further developments of the invention are the subject matter of additional claims.

With the invention the function of optical repeater is realized with the aid of one single structural element. This is, in principle, a phototransistor (collector-base diode in non-conducting direction as photodetector), with the emitter-base pn-junction being formed as laser diode. This laser diode is driven with the aid of a base bias current to approximately the threshold $I_{th}$. The additional current, which drives the laser diode to lase, is supplied by the (avalanche-amplified) photocurrent of the base-collector junction.

The significant factor here is the combination of three functions, specifically the optical to electrical conversion, the amplification (transistor effect, avalanche effect, laser) and the electrical to optical conversion in one single element.

The advantages gained with the invention include, in particular, that the photo-lasertransistor can be used to exercise the following functions:

As an optical repeater and, respectively optical amplifier.

To repeat optical data signals with respect to amplitude and pulse duration through appropriate selection of the direct base voltage. If the laser diode is biased by the bias current to operate above the threshold $I_{th}$, approximately linear amplification of arriving optical signals is possible, and, specifically, due to the function of the component as an optical sensor.

As a wavelength converter.

The wavelength conversion becomes possible through suitable selection of the material composition of the semiconductor element.

As a basic building block for optical logic.

Depending on the bias current, an AND or, respectively, an OR function is possible.

As an opto-electrical switch.

The component can be used an optical receiver as well as also as optical transmitter.

An additional possible application is as a connection building block for an optical bus: the signal can be read electrically.

A phototransistor according to the invention has preferrably the following structure.

As starting material, an n+-GaAs basic substrate is used. n⁻-GaAs applied epitaxially on it as a collector forms the space-charge region (RLZ) and the acceleration path for the avalanche effect (a thin n+GaAs collector layer may additionally be applied as multiplication region). Epitaxially applied p-GaAlAs as a base forms the "confining layer" for the laser. The active laser region is formed by p+-GaAs. The n+-GaAlAs emitter represents the "confining layer" for the laser as well as also the "confining layer" for the charge carriers (holes) in the base (wide-band-gap-emitter). It is best, if in the basic substrate an etched back side recess is provided for coupling in fibers in order to achieve as high an absorbed light output at the light receiving pn-junction as possible. Emitter and base dopings are adjusted such that the inversion condition for the laser is fulfilled: $W_{Fn}-W_{Fp}>W_a$ (quasi-Fermi level of the n+-emitter minus quasi-Fermi level of the p+-base greater than band gap of the active region).

Apart from this embodiment, which is suitable for light of wavelength λ=850 nm, according to a further development of the invention an InP embodiment for light within a wavelength range of 1300 nm to 1550 can be realized. In principle, the same applies as for the GaAs embodiment; back side etching can be dispensed with due to the greater band gap of the InP substrate.

According to an advantageous model of the invention, the combination of GaAs emitter and GaAs active base region, Ge base and Si collector for a wavelength range of 800 nm to 900 nm can be realized.

The Si substrate utilized is provided with back side etching. The Si-collector as light absorber and acceleration space-charge region (RLZ) is n⁻-doped. A p-Ge base layer is provided for grid adjustment to the p-GaAlAs base, which also serves as "confining layer" for the laser. A p+-GaAs region forms the active region for the laser. The n+-GaAlAs emitter serves as light and charge carrier-"confining layer". Lastly, the laser condition must be fulfilled.

BRIEF DESCRIPTION OF THE DRAWING

The invention will be explained in greater detail in conjunction with preferred embodiments shown in the figures of the drawing, in which.

DESCRIPTION OF THE PREFERRED EMBODIMENTS

Figure 1:
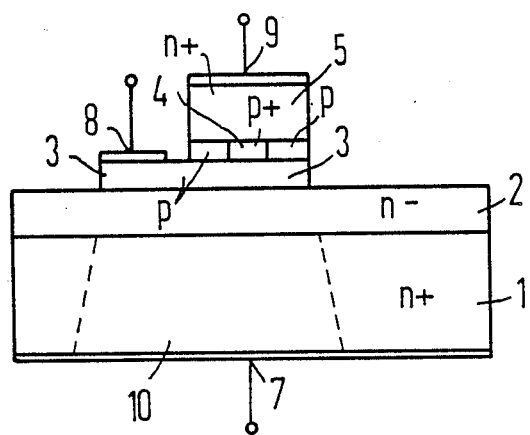
FIG. 1 shows a photo-lasertransistor according to the invention in section.

The photo-lasertransistor shown in FIG. 1 comprises in a first variant a $n^+$-GaAs or—as a second variant—a $n^+$-InP basic substrate 1. Below, the first (GaAs) and the second (InP) variant are differentiated by a slash. On the $n^+$-GaAs/InP basic substrate 1 a $n^-$-GaAs/InP layer is applied as a collector 2, which forms the space-charge region and acceleration path for the amplification effect. p-GaAlAs/InGaAsP applied epitaxially on it as a base 3 forms the boundary layer ("confining layer") of the laser-active base region 4 consisting of $p^+$-GaAs/InP. A $n^+$-GaAlAs/InGaAsP layer applied epitaxially on it as emitter 5 forms the other boundary layer ("confining layer") of the laser-active base region 4 as well as also the limiting layer ("confining layer") for the charge carriers of base 3. The dopings of emitter 5 and base 3 are so adjusted, that the inversion conditions for the laser diode are fulfilled. The basic substrate 1 is provided with a collector contact 7. Base 3 has a base contact 8 and the emitter 5 an emitter contact 9.

In order to decrease the losses of incident light, and/or respectively the light to be coupled in with a lightwave guide, an etched backside recess 10 is provided in the $n^+$ basic substrate 1 (indicated with dashed lines in the figures), which extends—as a function of the material, respectively, as a function of the wavelength-dependent penetration depth of the incident light—into the region of the light-receiving base collector pn-junction 3,2. In the second (InP) variant the etched backside recess 10 can be omitted due to the greater band gap of the InP basic substrate 1 without needing to accept significant light losses.

Figure 2:
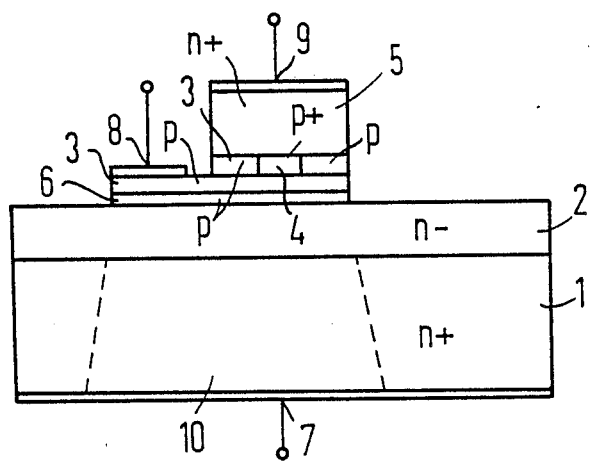
FIG. 2 shows a further embodiment of a photo-lasertransistor according to the invention, in section.

The photo-lasertransistor shown in FIG. 2 as additional (third) embodiment comprises a $n^+$-Si basic substrate 1, which has a $n^-$-Si layer as collector 2 applied epitaxially, which forms the space-charge region and acceleration path for the amplification effect. In this embodiment an additional layer, and specifically a p-Ge base layer 6, is provided for grid adjustment to the p-GaAlAs layer, which as bse 3 forms the one boundary layer ("confining layer") of the laser-active base region 4 consisting of $p^+$-GaAs. A $n^+$-GaAlAs layer is epitaxially applied on it as emitter 5, which forms the other boundary layer ("confining layer") of the laser-active base region 4 as well as also the boundary layer ("confining layer") for the charge carriers of base 3. Emitter and base dopings are so adjusted, that the inversion condition for the laser diode is fulfilled. Emitter 5 and respectively, base 3 are again provided with a contact 9 respectively 8 and the basic substrate 1 with the collector contact 7. In addition, it is advisable to provide in this embodiment an etched back side recess 10 in the basic substrate 1.

We claim:

1. A photo-laser transistor with a base-collector pn-junction biased in the non-conducting direction and a base-emitter pn-junction biased in the conducting direction, characterized in that:

the base-emitter pn-junction is formed as laser diode;

the laser diode is driven with a base bias current to approximately its threshold value;

additional current needed for exceeding the threshold is provided by amplified photocurrent of the base-collector pn-junction;

the photo-laser transistor comprises an $n^+$-InP basic substrate;

$n^-$-InP applied epitaxially as a collector forms a space-charge region and acceleration path for an amplification;

p-InGaAsP applied epitaxially thereon as a base forms a boundary layer of a laser-active base region consisting essentially of $p^+$-InP;

$n^+$-InGaAsP applied epitaxially thereon as an emitter forms the other boundary layer for charge carriers associated with the base; and emitter and base dopings are adjusted such that the inversion condition for the laser diode is fulfilled.

2. A photo-laser transistor with a base-collector pn-junction biased in the non-conducting direction and a base-emitter pn-junction biased in the conducting direction, characterized in that:

the base-emitter pn-junction is formed as a laser diode; the laser diode is driven with a base bias current to approximately its threshold value;

additional current needed for exceeding the threshold is provided by amplified photocurrent of the base-collector pn-junction;

the photo-laser transistor comprises an $n^+$-Si basic substrate;

an $n^-$-Si layer applied epitaxially thereon as a collector forms a space-charge region and acceleration path for an amplification effect;

a p-Ge base layer is provided for grid adjustment to a p-GaAlAs layer, which layer as a base forms one confining layer of a laser-active base region consisting essentially of $p^+$-GaAs;

an $n^+$-GaAlAs layer as an emitter applied epitaxially thereon forms the other confining layer of the laser-active region as well as the confining layer for the charge carriers associated with the base; and emitter and base dopings are adjusted such that the inversion condition for the laser diode is fulfilled.

3. A photo-laser transistor as recited in one of claims 1 and 2, characterized in that for decreasing the losses of incident light respectively the light, which is to be coupled with a lightwave guide in the $n^+$ basic substrate, an etched back side recess is provided, which—as a function of the material—extends up into the region of the light-receiving base-collector pn-junction.

* * * * *